(12) United States Patent
Ram et al.

(10) Patent No.: US 9,071,327 B2
(45) Date of Patent: Jun. 30, 2015

(54) EFFICIENT FREQUENCY ESTIMATION

(71) Applicant: Gilat Satellite Networks Ltd., Petah Tikva (IL)

(72) Inventors: Uzi Ram, Givat Elah (IL); Oded Bialer, Petah Tikva (IL)

(73) Assignee: Gilat Satellite Networks Ltd., Petah Tikva (IL)

( * ) Notice: Subject to any disclaimer, the term of this patent is extended or adjusted under 35 U.S.C. 154(b) by 0 days.

(21) Appl. No.: 14/084,076

(22) Filed: Nov. 19, 2013

(65) Prior Publication Data

US 2014/0146859 A1    May 29, 2014

Related U.S. Application Data

(60) Provisional application No. 61/730,204, filed on Nov. 27, 2012.

(51) Int. Cl.
| | |
|---|---|
| H03L 7/00 | (2006.01) |
| H04B 7/185 | (2006.01) |
| H04L 1/20 | (2006.01) |
| H04L 27/26 | (2006.01) |
| H04L 27/00 | (2006.01) |

(52) U.S. Cl.
CPC ............... *H04B 7/1851* (2013.01); *H04L 1/20* (2013.01); *H04L 27/266* (2013.01); *H03L 7/00* (2013.01); *H04L 27/0014* (2013.01)

(58) Field of Classification Search
CPC  H04B 7/1851; H04L 27/2675; H04L 27/266; H04L 1/20; H04L 27/0014; H03L 7/00
USPC ......... 375/316, 344, 355, 371, 377; 455/3.02, 455/427, 430, 12.1, 75, 192.2
See application file for complete search history.

(56) References Cited

U.S. PATENT DOCUMENTS

| | | | |
|---|---|---|---|
| 6,606,363 B1 * | 8/2003 | Atarius et al. ................. | 375/362 |
| 6,693,983 B1 * | 2/2004 | Moher et al. ................... | 375/341 |
| 7,865,158 B2 * | 1/2011 | Bultan et al. ............... | 455/192.2 |
| 8,259,874 B1 * | 9/2012 | Qi et al. ......................... | 375/343 |
| 8,638,882 B2 * | 1/2014 | Park et al. ...................... | 375/316 |
| 2006/0165128 A1 * | 7/2006 | Peake et al. ................... | 370/503 |
| 2007/0133716 A1 * | 6/2007 | Kim .............................. | 375/340 |
| 2008/0130813 A1 * | 6/2008 | Hwang et al. ................. | 375/371 |
| 2009/0046811 A1 * | 2/2009 | Murakami et al. ............ | 375/308 |
| 2009/0129514 A1 * | 5/2009 | Twitto ............................ | 375/341 |
| 2009/0196274 A1 * | 8/2009 | Rimini et al. ................. | 370/344 |
| 2009/0296629 A1 * | 12/2009 | Lincoln et al. ................ | 370/321 |
| 2010/0128816 A1 * | 5/2010 | Sun et al. ....................... | 375/298 |
| 2011/0033016 A1 * | 2/2011 | Jiang et al. ..................... | 375/354 |
| 2012/0309294 A1 * | 12/2012 | Jong et al. .................... | 455/13.2 |

* cited by examiner

*Primary Examiner* — Jean B Corrielus
(74) *Attorney, Agent, or Firm* — Banner & Witcoff, Ltd.

(57) ABSTRACT

Methods are presented herein for estimating at least a frequency (offset) for a block of received symbols using two or more estimation stages. These methods may allow reducing the computational complexity of a frequency estimator while maintaining large frequency offset coverage and high frequency estimation accuracy. Also presented herein are satellite communication systems employing a burst transmission or continuous transmission, and configured to estimate at least a frequency (offset) for a received burst or a block of received symbols using two or more estimation stages. In some embodiments, a received burst or a received block of symbols may include a Unique Word located at or about the center of the received burst or the block of symbols.

20 Claims, 6 Drawing Sheets

EFFICIENT FREQUENCY ESTIMATION

PRIORITY CLAIM

This application claims priority to U.S. Provisional Patent Application Serial No. 61/730,204, filed Nov. 27, 2012, and entitled "Efficient Frequency Estimation," the disclosure of which is incorporated by reference herein in its entirety and made part hereof.

FIELD

Aspects of the disclosure pertain to the fields of satellite communication systems and methods.

BACKGROUND

Frequency errors and phase noise are present in any satellite communication system. A receiving station in a satellite communication system often receives a transmission with a frequency error, i.e., at a somewhat different frequency than the expected frequency. This frequency error can result from frequency inaccuracies in any of the transmitting station (transmitter), the receiving station (receiver) and the satellite, phase noise introduced by frequency synthesizers at any of the transmitter, the receiver and the satellite, or motion of any of the transmitter, the receiver and the satellite (e.g., due to the Doppler Effect).

For efficient reception, receivers typically use coherent demodulation, which requires estimation of the frequency and phase of the received signal. However, both frequency errors and phase noise vary in time, each at a different rate. If the respective change rates are relatively low while the effective frequency error and phase are estimated, the effective frequency error and phase are often considered as time invariant (i.e., constant). Such an assumption is often used for burst transmissions.

In many systems, phase and frequency offsets are estimated using pilot symbols within the transmission. The pilot symbols are known both to the transmitter, which inserts them into the transmission, and to the receiver, which uses them. Estimation performance improves (i.e., the minimal signal to noise ratio (SNR) needed for an accurate enough estimation becomes lower) as the number of pilot symbols increases. On the other hand, increasing the number of pilot symbols also increases the transmission overhead, thus reducing the efficiency at which the satellite resource is utilized. Hence, minimizing the number of pilot symbols is often desired.

In order to eliminate the increase in transmission overhead due to using pilots, in some systems phase and frequency offsets are estimated based on non-pilot symbols. Extracting phase and frequency information from received non-pilot symbols requires applying a nonlinear operation on the received symbols for removing the modulation information. However, applying such nonlinear operation results also in an SNR reduction (also known as Squaring Loss). This SNR reduction increases as the original SNR becomes lower and as the modulation constellation size increases.

The Cramer Rao lower bound for frequency estimation mean square error (MSE) is given by (Eq. 1):

$$E\{(\hat{f} - f_t)^2\} = \frac{3}{2\pi^2 N^3} \cdot \frac{1}{SNR} \cdot \left(\frac{1}{T_A}\right)^2$$

Where E {x} represents the expectation of x, $\hat{f}$ represents the estimated frequency, $f_t$ represents the true frequency, N represents the number of samples used for deriving the frequency estimation, $T_A$ represents the sampling interval, and SNR represents the signal to noise ratio.

From (Eq. 1) it is clear that a longer sampling interval $T_A$ reduces the MSE of the frequency estimation (i.e., brings the estimation closer to the true value). However there is a limit on the length of the sampling interval $T_A$, since the frequency offset introduces a phase rotation and that phase rotation after $T_A$ has to be smaller than it in order to avoid ambiguity in the frequency estimation. Thus if pilot symbols are used, the choice of spacing between pilot symbols is a tradeoff between supporting a large frequency offset (for which the interval between pilot symbols has to be short in order to avoid ambiguity) and obtaining high estimation accuracy (for which the interval between pilot symbols has to be longer).

Implementation complexity plays an important role in satellite communication systems. Low computational complexity solutions are considered advantageous and can have direct influence on hardware cost. Hence low computational complexity phase and frequency estimators are often desired.

Maximum likelihood frequency offset estimation involves rotating received pilot symbols and/or the results of a nonlinear operation on unknown symbols according to all frequency offset hypotheses, summing the rotated symbols, and then choosing the hypothesis that attains the maximum absolute value. The frequency estimation resolution is dictated by the minimal difference between frequency hypotheses. As frequency estimation resolution becomes higher (i.e., the difference in frequency units between adjacent frequency offset hypotheses ($\Delta$) becomes smaller) and as the frequency offset range ($\Omega$) becomes higher, more hypotheses have to be tested. As the computational complexity increases with the number of hypotheses tested, the computational complexity is proportionate to the frequency offset range and to the required frequency estimation resolution (e.g., to the ratio $\Omega/\Delta$).

Unfortunately, the frequency offset range and the desired estimation resolution are often both high, thus the required number of hypotheses is extremely large and the frequency estimator is impractical for implementation. Thus, a low complexity frequency (offset) estimator that attains accurate estimation with a minimal amount of pilot symbols and supports a large frequency offset range is desired.

SUMMARY

The following presents a simplified summary in order to provide a basic understanding of some aspects of the disclosure. The summary is not an extensive overview of the disclosure. It is neither intended to identify key or critical elements of the disclosure nor to delineate the scope of the disclosure. The following summary merely presents some aspects of the disclosure in a simplified form as a prelude to the description below.

Aspects of the disclosure are directed to methods for estimating at least a frequency (offset) for a block of received symbols using two or more stages, at least for the purpose of reducing the computational complexity of a frequency estimator while maintaining large frequency offset coverage and high frequency estimation accuracy. The first estimation stage may be performed over a Unique Word, which may be a block of consecutive pilot symbols. As the time interval between consecutive symbols within a Unique Word may be very short, the first estimation stage may allow resolving large frequency offsets. The phase of the received symbols may be corrected in accordance with the frequency estimation associated with the first estimation stage and the second estimation stage may be performed on the phase-corrected symbols.

Since the error in the frequency estimation associated with the first estimation stage may be significantly smaller than the initial frequency offset, the second estimation stage may produce an even more accurate frequency (offset) estimation while using similar computational complexity as the first estimation stage, for example, by performing the second estimation stage on samples generated by summing groups of symbols or on non-consecutive symbols (e.g., pilot symbols).

Aspects of the disclosure are directed to methods for estimating at least a frequency (offset) for a block of received symbols using two or more stages, wherein the block of received symbols may include a Unique Word comprised of pilot symbols and wherein the Unique Word may be located at or about the center of the block of symbols. In some embodiments, a first estimation stage may be performed using only the symbols of the Unique Word. The second estimation stage may be performed over information symbols after their phase may be corrected in accordance with a frequency estimation associated with the first estimation stage and their modulation may be removed. In some embodiments, a first estimation stage may be performed using only the symbols of the Unique Word and the second estimation stage may be performed using additional pilot symbols included in said block of symbols (e.g., in addition to the pilot symbols making up the Unique Word), wherein the additional pilot symbols may be located at even intervals both prior to the Unique Word and after the Unique Word in a symmetric manner in reference to the Unique Word.

Aspects of the disclosure are directed to a satellite communication system comprising a hub and a plurality of terminals, wherein the terminals may be configured to transmit in bursts, e.g., towards the hub, wherein at least one transmitted burst may include a Unique Word (UW) located at or about the center of the burst, and wherein the hub may be configured to estimate at least a frequency (offset) for the burst using two or more estimation stages.

Aspects of the disclosure are directed to a satellite communication system comprising at least one terminal configured to transmit a continuous signal and at least one station configured to receive the continuous signal, wherein the at least one station may be configured to break the continuous signal into successive symbol blocks and to estimate at least a frequency (offset) for each symbols block using two or more estimation stages.

BRIEF DESCRIPTION OF THE DRAWINGS

Having thus described the disclosure in general terms, reference will now be made to the accompanying drawings, which are not necessarily drawn to scale, and wherein:

DETAILED DESCRIPTION

A frequency estimation method may be based on maximizing a target function over a set of discrete frequency hypotheses, the set of hypotheses may represent a grid of hypotheses covering a maximum frequency offset. Alternatively, a frequency estimation method may be based on minimizing a cost function over a similar set of discrete frequency hypotheses. Such maximization or minimization may be performed by calculating the target function or the cost function respectively for each of the discrete frequency hypotheses and then finding the frequency hypothesis that may attain the maximum target or the minimum cost respectively. As previously described, the computational complexity of a frequency estimator may be proportionate to a ratio marked as $\Omega/\Delta$, wherein $\Omega$ may represent a maximum frequency offset that the estimator may estimate and $\Delta$ may represent a minimum frequency difference between any two frequency-offset hypotheses (e.g., the search grid spacing).

Figure 3:
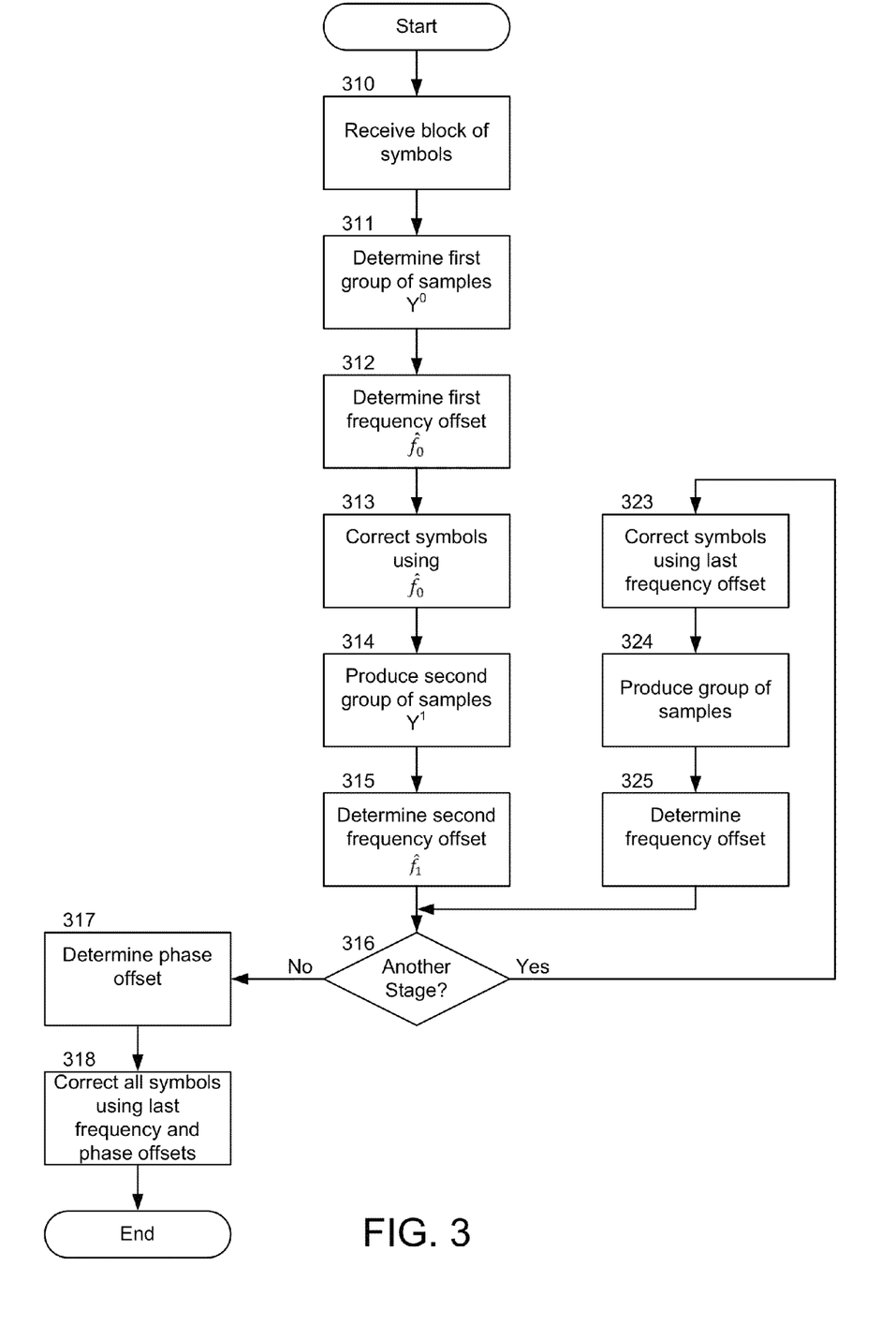
FIG. 3 shows a flow chart of a frequency estimation algorithm in accordance with aspects of the disclosure.

In one aspect of the disclosure, frequency (offset) estimation for a block of received symbols may be performed in two or more stages, as shown in FIG. 3, at least for the purpose of reducing the computational complexity of a frequency estimator while maintaining large frequency offset coverage and high frequency estimation accuracy.

Each stage of frequency (offset) estimation (e.g., 312 and 315) may utilize a new set of samples (e.g., 311 and 314) that may span a wider duration for at least the purpose of obtaining more accurate frequency estimation. A phase (offset) of the received symbols may also be estimated as part of the last estimation stage (317). Once a phase (offset) for the received symbols is estimated, the receiver may be configured to rotate the received symbols in accordance with the phase (offset) estimation (318) and to align the phase of the received symbols with a phase of the modulation constellation, for at least the purpose of facilitating coherent demodulation.

For the purpose of the following example, an estimator may utilize k stages, wherein i may represent the i-th stage (e.g., i=0 . . . k−1). Let $Y_i = \{y_0^i, y_1^i, \ldots, y_{N_i-1}^i\}$ represent a vector of $N_i$ samples that may be used in the i-th estimation stage. Let $\Omega_i$ represent a maximum frequency offset that the estimator may estimate after i−1 stages, wherein $\Omega_0$ may represent the initial maximum frequency offset (e.g., the maximum frequency offset that the estimator as a whole may estimate). Let $\Delta_i$ represent a minimum frequency search grid spacing at the i-th estimation stage. Let $T_i$ represent a minimum duration between two samples in the vector $Y_i$.

The maximum frequency offset associated with the first estimation stage ($\Omega_0$) may be relatively large. Consequently, the minimum search grid spacing associated with the first estimation stage ($\Delta_o$) may be set to a large enough value, for example in order to maintain the ratio $\Omega_0/\Delta_0$ sufficiently low, e.g., for at least the purpose of meeting a predefined (computational) complexity limitation. Furthermore, the minimum sample spacing associated with the first estimation stage ($T_0$) may be set at least in accordance with the maximum frequency offset associated with the first estimation stage ($\Omega_0$), e.g., for at least the purpose of avoiding a frequency offset estimation ambiguity. In some embodiments, a minimum sample spacing interval corresponding to the i-th estimation stage ($T_i$) may have to be shorter than a duration over which the phase of received symbols may rotate by 180 degrees, e.g., due to the maximum frequency offset at the i-th estimation stage ($\Omega_i$). Thus, since the minimum sample spacing associated with the first estimation stage ($T_0$) may be in reverse proportion to the maximum frequency offset associated with the first estimation stage ($\Omega_0$), and since the maximum frequency offset associated with the first estimation stage ($\Omega_0$) may be relatively large, the minimum sample spacing associated with the first estimation stage ($T_0$) may be a relatively short interval.

The target function or the cost function associated with the first estimation stage may be calculated over a relatively coarse discrete grid. Furthermore, the frequency hypothesis that attains the maximum target value or the minimum cost value respectively may be determined as the frequency estimation corresponding to the first estimation stage. In some embodiments, frequency estimation accuracy, either in the first estimation stage or in any of the other estimation stages, may be improved by using interpolation around the maximum target value or around the minimum cost value respectively. For example, after determining the frequency hypothesis corresponding to the maximum target value, the estimator may be configured to use the maximum target value and the target values corresponding to the two neighbors of the maximum target value in accordance with the frequency grid (e.g., one on each side of the frequency hypothesis corresponding to the maximum target value) in order to calculate a parabola corresponding to said three target values. Once the parabola is calculated, the estimator may be configured to determine an interpolated frequency hypothesis value, wherein the interpolated frequency hypothesis value may correspond to a frequency value that corresponds to a maximum value of said calculated parabola. In some embodiments, wherein a cost function may be used instead of a target function, an interpolation technique may be applied in a similar manner and the interpolated frequency hypothesis may correspond to a frequency value that corresponds to a minimum value of said calculated parabola.

Once a frequency estimation corresponding to the first estimation stage is obtained, the received symbols may be corrected at least in accordance with the frequency offset corresponding to the first estimation stage (313). As a result, the maximum frequency offset associated with the second estimation stage ($\Omega_1$) may be lower than the maximum frequency offset associated with the first estimation stage ($\Omega_0$).

The reduced maximum frequency offset associated with the second estimation stage ($\Omega_1$) may yield two important outcomes that may significantly improve the estimation accuracy at the second estimation stage. The first outcome may be that the minimum search grid spacing associated with the second estimation stage ($\Delta_1$) may be set lower than the minimum search grid spacing associated the first estimation stage ($\Delta_0$) (e.g., $\Delta_1 < \Delta_0$), while still maintaining the ratio $\Omega_1/\Delta_1$ sufficiently low, e.g., for at least the purpose of meeting a (computational) complexity limitation. The second outcome may be that the minimum sample spacing associated with the second estimation stage ($T_1$) may be significantly higher than the minimum sample spacing associated with the first estimation stage ($T_0$) (e.g., $T_1 >> T_0$). As previously described, the frequency estimation root mean square error may be reduced in a linear proportion to increasing the minimum sample spacing (e.g., $T_1$). Thus, the target function or the cost function associated with the second estimation stage may be calculated over a finer discrete grid (e.g., compared to the grid associated with the first estimation stage) and the frequency hypothesis that attains the maximum target value or the minimum cost value respectively may be determined as the frequency estimation corresponding to the second estimation stage. As previously described, the frequency estimation accuracy may be further improved by using interpolation around the maximum value of the target function or around the minimum value of the cost function associated with the second estimation stage.

In some embodiments, the estimator may include more than two stages (e.g., k>2) (316). In such embodiments the phase of the received symbols may be corrected according to the frequency estimation corresponding to the second estimation stage (323) and the above described process (e.g., estimation and correction) may be repeated in a similar manner for any of one or more additional stages (e.g., i=2 . . . k−1) (323, 324 and 325). As the estimation stage index (i) increases, the maximum frequency offset ($\Omega_i$) and the minimum search grid spacing ($\Delta_i$) associated with the i-th estimation stage may be reduced and the minimum sample spacing associated with the i-th estimation stage ($T_i$) may be increased, e.g., for at least the purpose of improving the frequency estimation accuracy.

It may be noted that the above described estimation method and/or estimator may be of low complexity at all stages and still successfully estimate large initial frequency errors ($\Omega_0$) at high accuracy.

Figure 1:
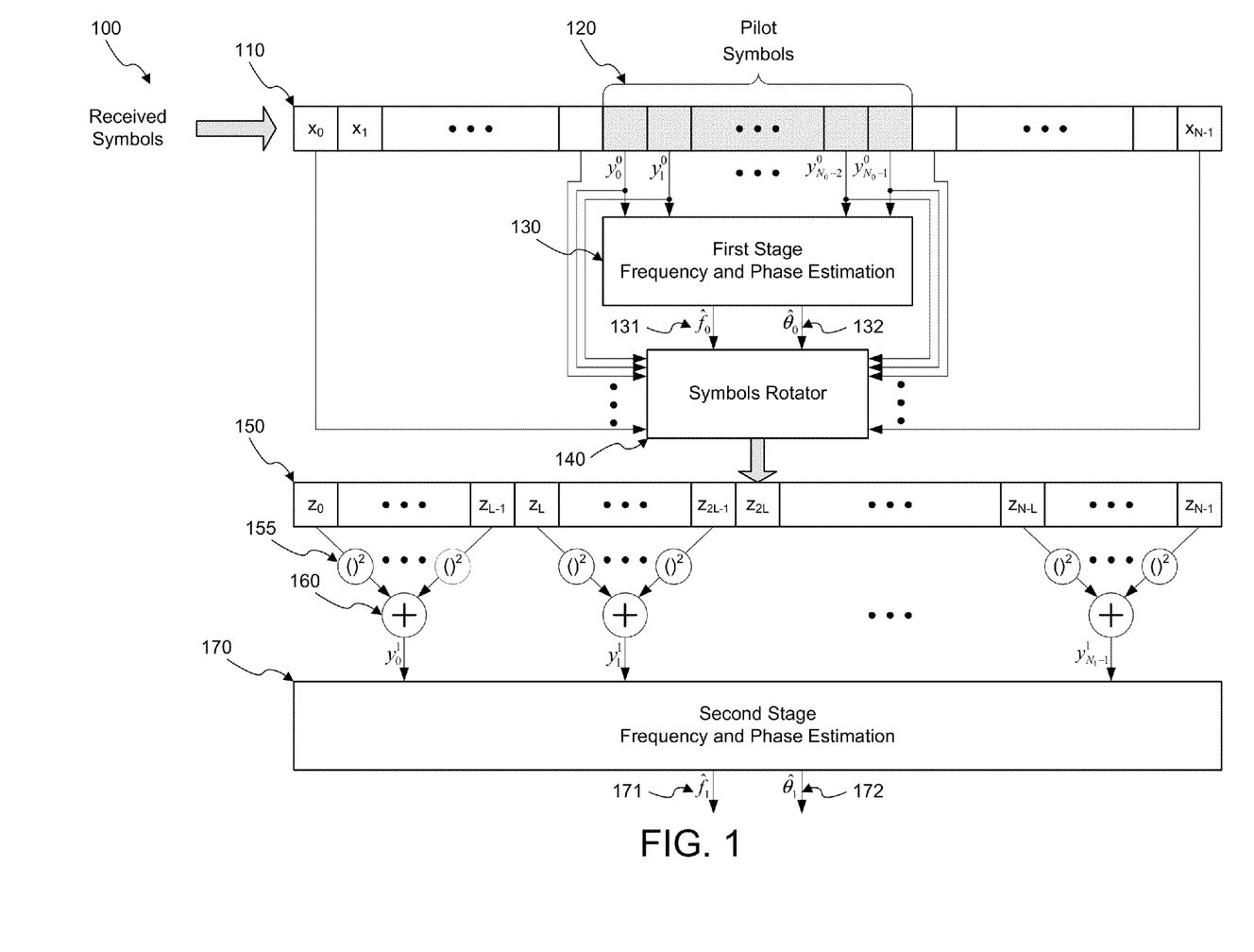
FIG. 1 shows an example embodiment of an estimator which may use pilots in a first stage of the estimation, in accordance with aspects of the disclosure.

FIG. 1 shows an example embodiment of a two-stage estimator 100 in accordance with the estimation method and/or estimator previously described. In this example embodiment, the estimator may be configured to use pilot symbols 120 for the first estimation stage only.

In this example, the minimum sample spacing associated with the first estimation stage ($T_0$) may be equal to the duration of a symbol. In addition, pilot symbols 120 may be located as a group of consecutive symbols (also referred to as Unique Word) at or about the center of a block of symbols being processed 110 (e.g., at or about the center of a received burst). Placing pilot symbols 120 at or about the center of the block of symbols being processed 110 may result in minimizing phase offsets (e.g., that may result from a residual frequency estimation error) at both edges of said block of symbols 110. In addition, placing pilot symbols 120 at or about the center of a block of symbols being processed 110 may minimize the maximum interval between the location of the pilot symbols (e.g., where initial frequency estimation may be performed) and any other symbol in said block of symbols 110. Such minimization may prove advantageous if the reception frequency changes during the symbols' block interval, for example, due to the Doppler Effect if the transmitter and/or the receiver are on the move.

Let a frequency hypothesis of the first estimation stage 130 be denoted as $f_0$. A target function associated with the first estimation stage 130 may be the following function (Eq. 2), wherein $N_0$ may represent the number of samples (e.g., the number of pilot symbols 120) and $y_n^0$ may represent the processed samples (e.g., the pilot symbols):

$$\left| \sum_{n=0}^{N_0-1} y_n^0 \cdot e^{-j\frac{2\pi \cdot f_0 n}{N_0}} \right|$$

Thus, the frequency estimation corresponding to the first estimation stage ($\hat{f}_0$) (131) may be calculated as the maximum value of the target function associated with the first estimation stage (Eq. 2) going over all the frequency hypotheses of the first estimation stage 130, e.g., (Eq. 3):

$$\hat{f}_0 = \mathrm{argmax}_{f_0} \left| \sum_{n=0}^{N_0-1} y_n^0 \cdot e^{-j\frac{2\pi \cdot f_0 n}{N_0}} \right|$$

In addition, a phase offset for the block of symbols being processed 110 corresponding to the first estimation stage ($\hat{\theta}_0$)

(132) may be estimated from the estimated frequency corresponding to the first estimation stage ($\hat{f}_0$) (131), as follows (Eq. 4), wherein ∠ may represent the angle operator:

$$\hat{\theta}_0 = \angle\left(\sum_{n=0}^{N_0-1} y_n^0 \cdot e^{-j\frac{2\pi \cdot \hat{f}_0 n}{N_0}}\right)$$

In some embodiments, the frequency estimation function (Eq. 3) may be efficiently implemented by searching the maximum absolute value of a Discrete Fourier Transform (DFT) or a Fast Fourier Transform (FFT) (with sufficient zero padding) of the vector $Y^0$, wherein the vector $Y^0$ may include $N_0$ symbols to be processed at the first estimation stage. In such embodiments, the estimated phase may be the phase associated with the DFT or the FFT bin containing the maximum absolute value (e.g., corresponding to the estimated frequency).

Let $x_n$ (e.g., $x_0, x_1, \ldots, x_{N-1}$) denote all the symbols of the block of symbols being processed 110 (e.g., including pilot symbols 120). The phase and/or the frequency of these symbols may be corrected according to any of the frequency and the phase offsets corresponding to the first estimation stage 130 (e.g., $\hat{f}_0$ (131) and $\hat{\theta}_0$ (132) respectively). The resulting symbols may be denoted as $z_n$ (e.g., $z_0, z_1, \ldots, z_{N-1}$) (150), wherein the symbols $z_n$ may be derived from the (original) symbols $x_n$ (110) as follows (Eq. 5) (e.g., using symbols rotator 140):

$$z_n = x_n \cdot e^{-2\pi(\hat{f}_0 n + \hat{\theta}_0)}$$

The second estimation stage 170 may be performed in accordance with the frequency and phase corrected $z_n$ symbols (150), wherein the symbols used for the frequency estimation may include (many) non-pilot symbols, e.g., symbols for which the modulated information may be unknown. To remove the modulated information, a nonlinear operation may be applied to the $z_n$ symbols to produce modulation-free symbols, e.g., denoted as $r_n$ (e.g., $r_0, r_1, \ldots, r_{N-1}$). In some embodiments, wherein the Binary Phase Shift Keying (BPSK) modulation may be used, the nonlinear operation may be the squaring operation (155). In such embodiments, the $r_n$ symbols may be derived from the $z_n$ symbols by $r_n = (z_n)^2$.

Let $T_S$ represent an interval between adjacent $r_n$ symbols. Let $\sigma_0$ represent a root mean square error associated with a frequency estimation corresponding to the first stage (e.g., with $\hat{f}_0$). In some embodiments, the minimum sample spacing associated with the second estimation stage ($T_1$) may be determined such that a total phase rotation over said sample spacing period ($T_1$) may be small enough to allow coherent summation while sustaining only low loss (e.g., adding samples with a total phase rotation of 90 degrees may result in about 1 dB loss). In some embodiments, where the $r_n$ symbols may be a result of a squaring operation, the phase error of the $r_n$ symbols may be twice as large (e.g., due to the squaring operation). In such embodiments, a minimum sample spacing period associated with the second estimation stage ($T_1$) may be determined so that the total phase rotation over the sample spacing period ($T_1$) may be lower than 45 degrees (e.g., the expression $2\pi\sigma_0 T_1 < \pi/4$ may be true), at least for the purpose of maintaining a summation loss of up to about 1 dB.

Let L represent a truncation to a nearest integer of a ratio between the minimum sample spacing period associated with the second estimation stage 170 ($T_1$) and the interval between adjacent $r_n$ symbols (e.g., the ratio $T_1/T_S$). Thus, each sample used for the second estimation stage ($y_n^1$) may be derived from the symbols $r_n$ by summing L consecutive symbols (160), e.g., (Eq. 6):

$$y_n^1 = \sum_{i=nL}^{(n+1)L-1} r_i$$

Let a frequency hypothesis of the second estimation stage 170 be denoted as $f_1$. A target function associated with the second estimation stage 170 may be the following function (Eq. 7):

$$\left|\sum_{n=0}^{N_1-1} y_n^1 \cdot e^{-j\frac{2\pi \cdot f_1 n}{N_1}}\right|$$

Thus, the frequency estimation corresponding to the second estimation stage ($\hat{f}_1$) (171) may be calculated as the maximum value of the target function associated with the second estimation stage (Eq. 7) going over all the frequency hypotheses of the second estimation stage 170, e.g., (Eq. 8):

$$\hat{f}_1 = \text{argmax}_{f_1}\left|\sum_{n=0}^{N_1-1} y_n^1 \cdot e^{-j\frac{2\pi \cdot f_1 n}{N_1}}\right|$$

In addition, a phase offset for the block of symbols being processed 110 corresponding to the second estimation stage ($\hat{\theta}_1$) (172) may be estimated from the estimated frequency corresponding to the second estimation stage ($\hat{f}_1$) (171), as follows (Eq. 9), wherein ∠ may represent the angle operator:

$$\hat{\theta}_1 = \angle\left(\sum_{n=0}^{N_1-1} y_n^1 \cdot e^{-j\frac{2\pi \cdot \hat{f}_1 n}{N_1}}\right)$$

If the SNR of the samples used for the second estimation stage 170 ($y_n^1$) equals the SNR of the samples used in the first estimation stage 130 ($y_n^0$), and if the number of samples processed in both stages is the same (e.g., $N_0 = N_1$), then, since the ratio between the minimum sample spacing periods of the two stages may be L (e.g., $T_1 = L \cdot T_0$), the root mean square error (RMSE) (e.g., according to (Eq. 1)) of the frequency estimation corresponding to the second estimation state ($\hat{f}_1$) (171) may be L times smaller than the RMSE of the frequency estimation corresponding to the first estimation stage ($\hat{f}_0$) (131).

It may be noted that the frequency and the phase estimations corresponding to the second estimation stage 170 may be based on samples associated with the second estimation stage 170. Thus, in embodiments where the samples for the second estimation stage 170 may be derived from symbols being processed through a squaring operation (not shown in FIG. 1), frequency and phase estimations for the symbols being processed 110 may be obtained by dividing the frequency and phase estimations corresponding to the second estimation stage 170 by two and further dividing the frequency estimation corresponding to the second estimation stage 170 by L, e.g., due to a distance of L symbols between second stage $y_n^1$ samples.

Figure 2:
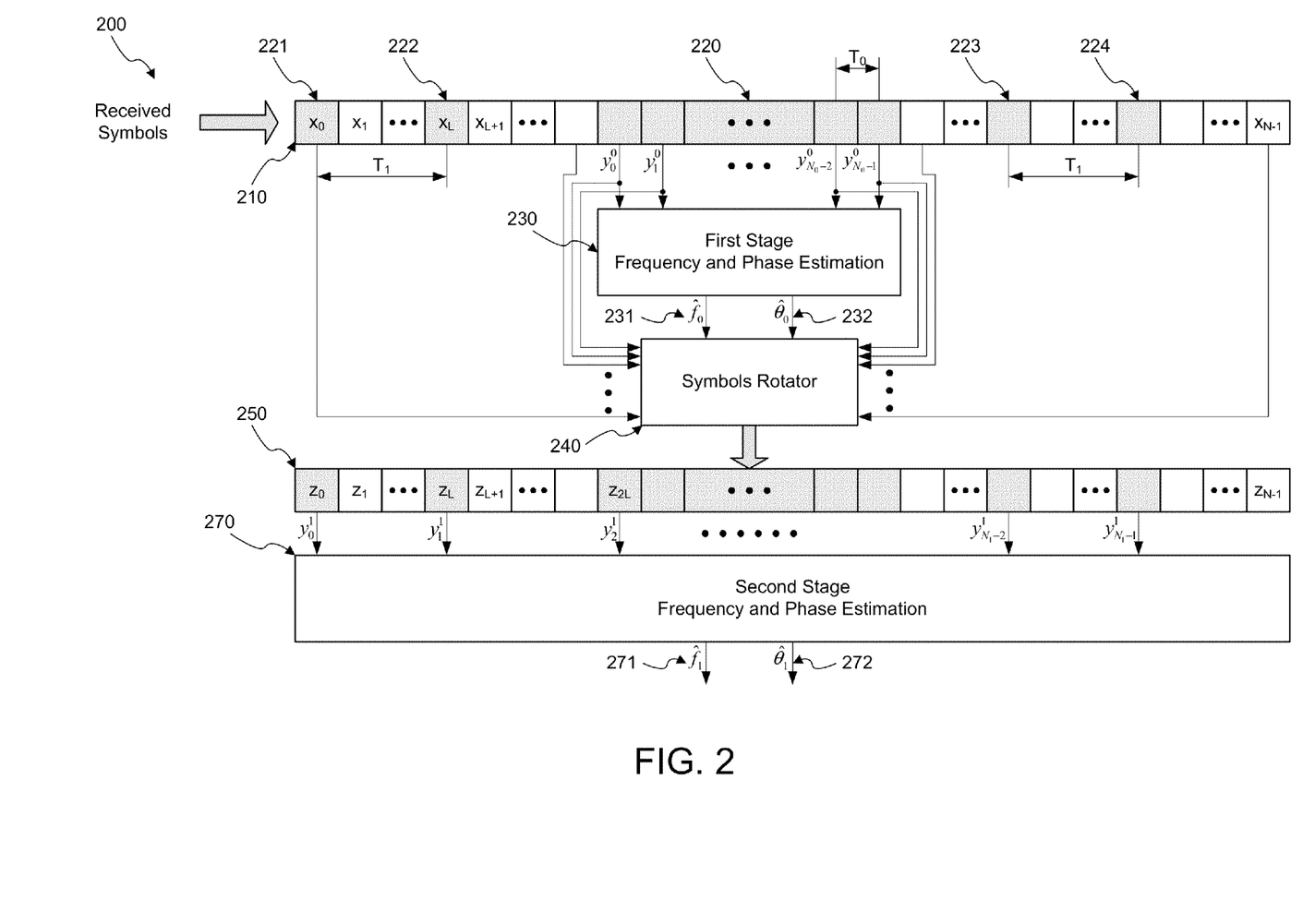
FIG. 2 shows an example embodiment of an estimator which may use pilots in a first stage and in a second stage of the estimation, in accordance with aspects of the disclosure.

FIG. 2 shows an example embodiment of a two-stage estimator 200 in accordance with the estimation method and/or estimator previously described. In this example embodiment, the estimator may be configured to use pilot symbols for both the first estimation stage and the second estimation stage.

In this example, the first estimation stage 230 may be similar to first estimation stage as described for the previous example (e.g., the one referring to FIG. 1). The estimation may be based on pilot symbols 220 located at or about the center of the block of symbols being processed 210, wherein the minimum sample spacing associated with the first estimation stage 230 ($T_0$) may be equal to the duration of a symbol. Thus, after the frequency estimation and the phase estimation corresponding to the first estimation stage 230 may be determined (e.g., $\hat{f}_0$ (231) and $\hat{\theta}_0$ (232) respectively), the symbols $z_n$ (e.g., $z_0, z_1, \ldots, z_{N-1}$) (250) may be obtained by rotating (240) the symbols being processed 210 ($x_n$) in accordance with the frequency and phase estimations corresponding to the first estimation stage 230 (e.g., as shown in (Eq. 5)).

The samples that may be used for the second estimation stage ($y_n^1$) may correspond to known pilot symbols, e.g., pilot symbols 221 to 224, after their modulation is removed. The minimum sample spacing period associated with the second estimation stage 270 ($T_1$) may correspond to the interval between said pilot symbols (e.g., between pilot symbols 221 and 222, or between pilot symbols 223 and 224) used for the second estimation stage 270. That interval may be chosen in a manner similar to the manner described for the previous example. Let L represent the number of symbols between any two adjacent pilot symbols that may be used for the second estimation stage 270 ($y_n^1$).

In some embodiments, instead of placing a single pilot symbol every L symbols as previously described, a group of M successive pilot symbols may be placed every L symbols, for example, so that the distance between the first symbols of two adjacent pilot symbol groups may be L symbols. In such embodiments, a known modulation may be removed from each pilot symbol (e.g., by counter-rotation according to the known modulation) and then the M pilot symbols of each group of pilot symbols may be added to combine a single symbol for further frequency and phase estimation, wherein the combined symbols may be L symbols apart.

Let a frequency hypothesis of the second estimation stage 270 be denoted as $f_1$. A target function associated with the second estimation stage 270 may be the following function (Eq. 10):

$$\left| \sum_{n=0}^{N_1-1} y_n^1 \cdot e^{-j\frac{2\pi \cdot f_1 n}{N_1}} \right|$$

Let c represent the maximum value of the target function associated with the second estimation stage (Eq. 10) going over all the frequency hypotheses of the second estimation stage 270, e.g., (Eq. 11):

$$c = \mathrm{argmax}_{f_1} \left| \sum_{n=0}^{N_1-1} y_n^1 \cdot e^{-j\frac{2\pi \cdot f_1 n}{N_1}} \right|$$

Thus, the frequency estimation corresponding to the second estimation stage ($\hat{f}_1$) (271) (e.g., the phase increment between adjacent symbols) may be calculated as $\hat{f}_1 = c/L$, and the phase estimation corresponding to the second estimation stage ($\hat{\theta}_1$) (272) may be estimated from the maximum value of the target function associated with the second estimation stage (c), as follows (Eq. 12), wherein ∠ may represent the angle operator:

$$\hat{\theta}_1 = \angle \left( \sum_{n=0}^{N_1-1} y_n^1 \cdot e^{-j\frac{2\pi \cdot f_1 n}{N_1}} \right)$$

Figure 4:
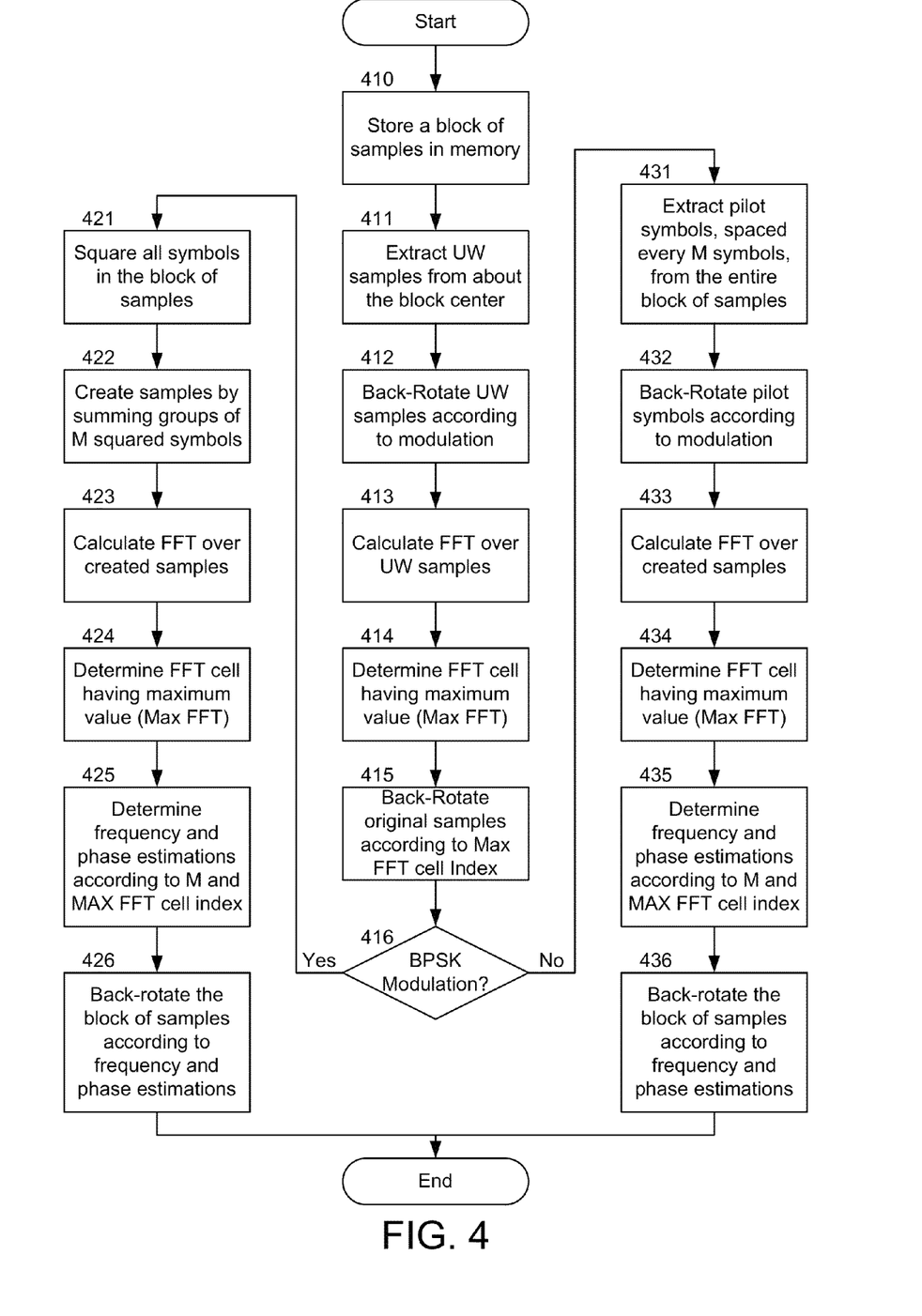
FIG. 4 shows a flow chart of an example two-stage frequency estimation algorithm in accordance with aspects of the disclosure.

FIG. 4 shows an example two-stage frequency estimation algorithm for a received block of symbols, wherein the block of symbols includes a Unique Word comprised of pilot symbols and wherein the Unique Word may be located at or about the center of the block of symbols.

Upon receiving the block of symbols, digital samples corresponding to said block of symbols may be stored in a memory device (410), at least for the purpose of further processing as described herein. Thus references in the following description to operations that may be performed on symbols may be interpreted as operations done on the digital samples corresponding to said symbols.

Once the samples corresponding to said block of symbols are stored (410), the samples corresponding to the Unique Word, which may be located at or about the center of the block of symbols, may be extracted from the block of samples (411) and then back-rotated in accordance with their known modulation property. A target function based on Fast Fourier Transform (FFT) may then be calculated over the modulation-free Unique Word samples (413) and an FFT cell having a maximum value (Max FFT) may be determined (414). The original block of samples may be then back-rotated in accordance with frequency offset estimation derived in accordance with an index of the determined Max FFT cell (415).

In this example, the second stage of estimation may depend on a modulation property of the block of symbols.

In some embodiments, where the block of symbols may be modulated using BPSK modulation (416), the entire block of samples may be used for the second estimation stage. All back-rotated symbols in accordance with the first estimation stage may be squared (421) (e.g., for at least the purpose of eliminating modulation information) and a new vector of samples may be created, wherein each sample in the new vector of samples may be created by summing groups of M square symbols (422). A target function based on Fast Fourier Transform (FFT) may then be calculated over the new vector of samples (423) and an FFT cell having a maximum value (Max FFT) may be determined (424). Frequency offset estimation may then be derived in accordance with the index of the determined Max FFT cell (425), for example, by dividing it by 2*M. In addition, phase offset estimation may also be derived (425), for example, by dividing a phase associated with the Max FFT cell by a factor of 2 (e.g., due to said squaring). At this point, the block of samples used as input to the second estimation phase (e.g., at the input to step 421) may be back-rotated in accordance with the estimated frequency offset and phase offset (426).

In some embodiments, where the block of symbols may be modulated using a modulation scheme other than BPSK (416), the second estimation stage may be performed using additional pilot symbols, which may be included in the block of symbols, wherein the additional pilot symbols may be evenly spread M symbols apart over the entire block of symbols. The said pilot symbols may be extracted from the block of symbols back-rotated in accordance with the first estimation stage (431) and then further back-rotated in accordance with their know modulation property (432) (e.g., for at least the purpose of eliminating modulation information from said pilot symbols). A target function based on Fast Fourier Transform (FFT) may then be calculated over the modulation-free pilot symbols (433) and an FFT cell having a maximum value (Max FFT) may be determined (434). Frequency offset estimation may then be derived in accordance with the index of the determined Max FFT cell (435), for example, by dividing it by M. In addition, phase offset estimation may also be derived (435), for example from a phase associated with the Max FFT cell. At this point, the block of samples used as input to the second estimation phase (e.g., at the input to step 431) may be back-rotated in accordance with the estimated frequency offset and phase offset (436).

Figure 5:
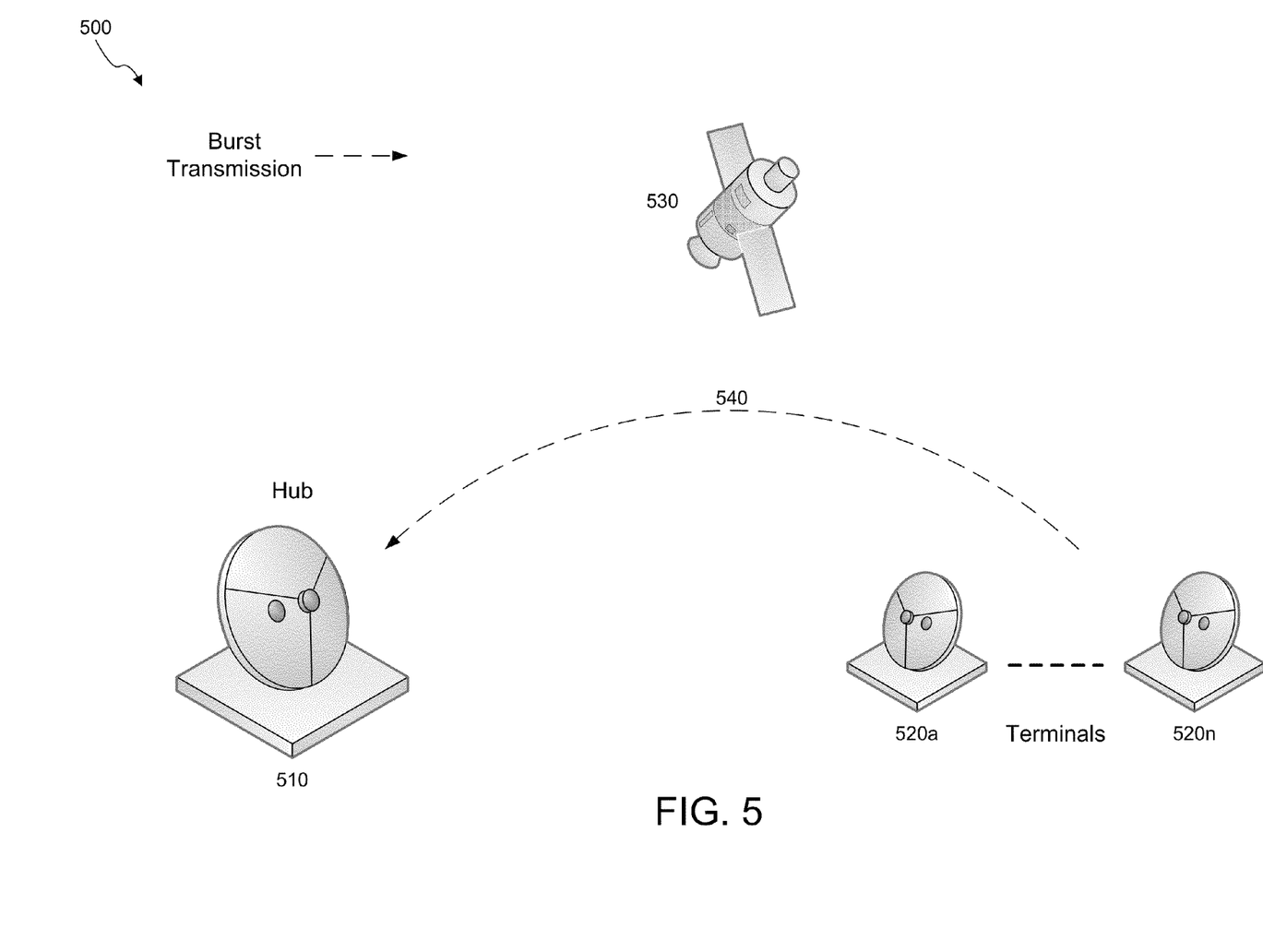
FIG. 5 shows a diagram of a first satellite communication system in accordance with aspects of the disclosure.

FIG. 5 shows a satellite communication system (500) that may comprise a hub (510) and a plurality of terminals (520a-n), wherein the terminals may be configured to transmit in bursts (540), for example, towards the hub, and the hub may be configured to receive transmission bursts from the plurality of terminals.

In another aspect of the disclosure, at least one of said transmission bursts may include a Unique Word comprising a group of consecutive pilot symbols, wherein the Unique Word may be located at or about the center of the burst, for example, as shown in FIG. 1 (e.g., Unique Word 120 may be located at or about the center of a block of symbols 110, wherein block of symbols 110 may correspond to a transmission burst). Thus, in said at least one burst, about half the symbols carrying encoded information may be transmitted (and/or received) prior to transmitting (and/or receiving) the Unique Word symbols, and about half the symbols carrying encoded information may be transmitted (and/or received) after transmitting (and/or receiving) the Unique Word symbols.

As previously described, said at least one burst may be received with a frequency error, e.g., at a somewhat different frequency than expected (e.g., by the hub). Thus, the hub may be configured to estimate the frequency (offset) of said at least one burst using two or more estimation stages, for example, in accordance with at least one of the methods previously described. In addition, said at least one burst may be received at the hub also with some timing uncertainty. Thus, the hub may be configured to, upon receiving said at least one burst, search for the position of the Unique Word symbols within the received burst, wherein this search may be in accordance with at least a predetermined timing window. In some embodiments, searching the position of the Unique Word within the received burst may comprise a process of correlating the known Unique Word symbols at every possible timing position in accordance with the timing uncertainty window.

However, in order to perform the first frequency (offset) estimation stage, the hub may need to determine where the Unique Word is located within the block of symbols being processed (e.g., the symbols corresponding to the received burst). On the other hand, if the burst is received with a frequency offset, the phase of the Unique Word symbols within the burst may be significantly rotated. Hence, a correlation process may not allow determining of the Unique Word position within the received burst.

In order to resolve the conflict described above, the first frequency (offset) estimation stage may be performed for several time hypotheses, each time hypothesis being associated with a different position for the Unique Word symbols within the burst. The number of timing hypotheses may vary at least in accordance with the size of the timing uncertainty window and in accordance with the sampling rate at which the received symbols may be sampled (e.g., in some embodiments the received symbols may be sampled at a resolution of 4 samples per symbol). The hub may be configured to determine both course frequency (offset) estimation and course timing estimation for the received burst through determining the maximum of a target function associated with the first frequency estimation stage going over all timing hypotheses. In some embodiments, where the encoded information symbols may be modulated using BPSK modulation, the target function associated with the first frequency estimation stage may include a Fast Fourier Transform (FFT) over the Unique Word (e.g., after removing the modulation from the pilot symbols making up the Unique Word) and determining the maximum of the target function may include selecting the FFT frequency cell having the maximum value.

As previously described, the hub may be configured to estimate the frequency (offset) of a received burst using two or more estimation stages, wherein the first estimation stage may also include consideration of a timing uncertainty at which the burst may be received. For the second frequency (offset) estimation stage, the hub may be configured to back-rotate (correct) the encoded information symbols in accordance with a frequency estimation associated with the first estimation stage, square the corrected encoded information symbols, and sum groups of L consecutive squared and corrected symbols to produce samples, which may then be used for calculating a target function associated with the second estimation stage.

In some embodiments, the hub may be configured to use FFT over said samples in order to calculate a target function associated with the second estimation stage and to determine the maximum of the target function associated with the second estimation stage by selecting the FFT frequency cell having the maximum value. Once the maximum of the target function is determined, the hub may be configured to determine the frequency (offset) estimation and the phase estimation associated with the second estimation stage. The frequency offset estimation may be determined by dividing the frequency offset associated with the maximum of the target function by a factor of 2 (e.g., due to the effect of squaring the symbols) and then further by L (e.g., due to each sample being a combination of L symbols). The phase estimation may be derived from the phase associated with the maximum of the target function by dividing that phase by a factor of 2. Once frequency and phase estimations may be derived, the hub may be configured to back-rotate all the received symbols, for example, in order to align their phase with the original modulation constellation and thus to complete the demodulation of the burst.

In some embodiments, the encoded information symbols may be modulated using high constellation modulation, for example, Quad Phase Shift Keying (QPSK) or 8-Phase Shift Keying (8PSK). Said at least one burst may include pilot symbols in addition to the pilot symbols making up the Unique Word, wherein these additional pilot symbols may be located at even intervals (e.g., every L symbols) both prior to the Unique Word and after the Unique Word in a symmetric manner in reference to the Unique Word, for example, as shown in FIG. 2 (e.g., pilot symbols 221 to 224, wherein pilot symbols 220 may constitute the Unique Word). The first frequency (offset) estimation stage may be performed as previously described above. The second frequency (offset) estimation stage may include rotating (correcting) the additional pilot symbols in accordance with a frequency estimation associated with the first estimation stage, removing the known modulation from the corrected pilot symbols to produce a vector of samples, calculating FFT over said vector of samples, and determining the frequency (offset) associated with the second estimation stage in accordance with the FFT frequency cell having the maximum value. The frequency offset estimation may be determined by dividing the frequency offset associated with the maximum FFT value by L (e.g., due to the additional pilot symbols being positioned at intervals of L symbol), and the phase estimation may be determined in accordance with a phase associated with the FFT cell having the maximum value. The frequency and phase estimations may then be used for rotating all the symbols included in said burst back to the original modulation constellation, thus completing the demodulation of the burst.

Figure 6:
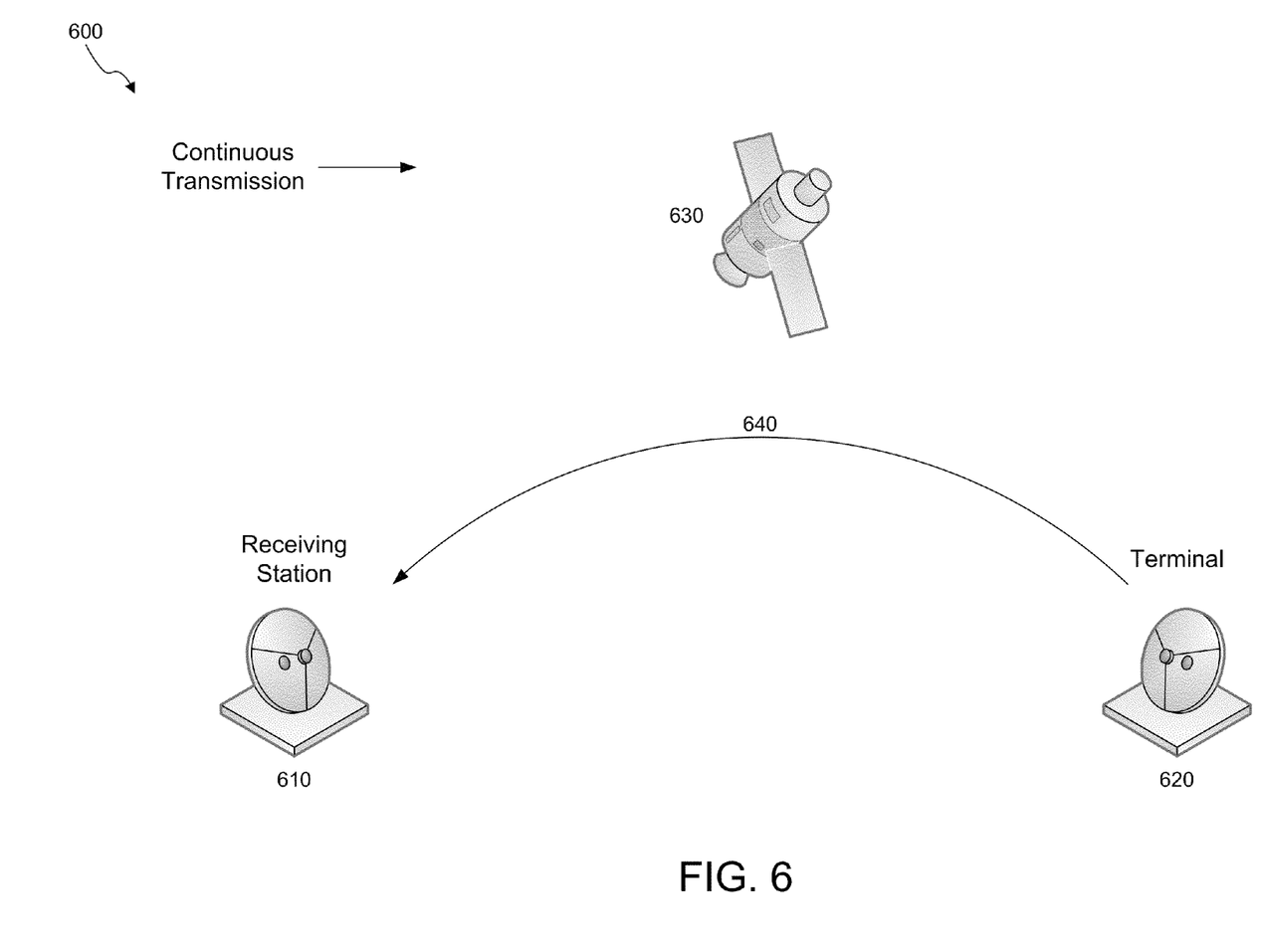
FIG. 6 shows a diagram of a second satellite communication system in accordance with aspects of the disclosure.

FIG. 6 shows a satellite communication system (600) in accordance with one or more aspects of the disclosure. Satellite communication system (600) may include at least one terminal (620) configured to transmit a continuous signal (640) and a receiving station (610) configured to receive the continuous signal by breaking the continuous signal into successive symbol blocks and processing each symbol block like a burst transmission, for example, in accordance with any of the methods described above. Each symbol block may be estimated for frequency and/or phase (offset) using two or more estimation stages as per any of the examples previously described. However, unlike burst reception, any timing uncertainty may be resolved once (e.g., upon locking and/or synchronizing on the signal) and then tracked for as long as the continuous signal is received, for example, using a timing tracking mechanism.

Various aspects of the disclosure may be embodied as one or more methods, systems, apparatuses (e.g., components of a satellite communication network), and/or computer program products. Accordingly, those aspects may take the form of an entirely hardware embodiment, an entirely software embodiment, an entirely firmware embodiment, or an embodiment combining firmware, software, and/or hardware aspects. Furthermore, such aspects may take the form of a computer program product stored by one or more computer-readable storage media having computer-readable program code, or instructions, embodied in or on the storage media. Any suitable computer readable storage media may be utilized, including hard disks, CD-ROMs, optical storage devices, magnetic storage devices, and/or any combination thereof. In some embodiments, one or more computer readable media storing instructions may be used. The instructions, when executed, may cause one or more apparatuses to perform one or more acts described herein. The one or more computer readable media may comprise transitory and/or non-transitory media. In addition, various signals representing data or events as described herein may be transferred between a source and a destination in the form of electromagnetic waves traveling through signal-conducting media such as metal wires, optical fibers, and/or wireless transmission media (e.g., air and/or space).

Modifications may be made to the various embodiments described herein by those skilled in the art. For example, each of the elements of the aforementioned embodiments may be utilized alone or in combination or sub-combination with elements of the other embodiments. It will also be appreciated and understood that modifications may be made without departing from the true spirit and scope of the present disclosure. The description is thus to be regarded as illustrative instead of restrictive on the present disclosure.

What is claimed is:

1. A method, comprising:
   receiving a block of symbols;
   determining a first group of samples, the first group of samples corresponding to a first group of symbols included in the block of symbols, the first group of samples corresponding to a first interval determined in accordance with a maximum frequency offset;
   determining, in accordance with the first group of samples, a first frequency offset estimation associated with the block of symbols;
   back-rotating one or more symbols in the block of symbols in accordance with at least the first frequency offset estimation;
   producing a second group of samples, the second group of samples corresponding to a second group of symbols that are based at least in part on symbols that are back-rotated according to the first frequency offset estimation, wherein the second group of samples correspond to a second interval that is longer than the first interval determined in accordance with the maximum frequency offset; and
   determining, in accordance with the second group of samples, a second frequency offset estimation associated with the block of symbols.

2. The method of claim 1, comprising:
   back-rotating one or more symbols in the block of symbols in accordance with the second frequency offset estimation;
   producing a third group of samples based at least in part on symbols that are back-rotated according to the second frequency offset estimation wherein the third group of samples corresponds to a third interval longer than the second interval; and
   determining, in accordance with the third group of samples, a third frequency offset estimation associated with the block of symbols.

3. The method of claim 1, comprising:
   calculating, based on the determining of the second frequency offset estimation, at least one of a frequency, a frequency offset, a phase, or a phase offset; and
   correcting, in accordance with one or more of the frequency, the frequency offset, the phase, or the phase offset, each symbol in the block of symbols.

4. The method of claim 1, wherein the first group of symbols included in the block of symbols comprises a plurality of consecutive pilot symbols that make up a unique word.

5. The method of claim 1, wherein producing the second group of samples comprises:
   removing modulation information from one or more symbols in the block of symbols by applying a non-linear operation to the one or more symbols; and
   producing each sample in the second group of samples by summing a group of consecutive modulation-free symbols.

6. The method of claim 1, wherein the second group of symbols comprises a plurality of evenly spaced pilot symbols.

7. The method of claim 1, comprising deriving from a plurality of evenly spaced groups of consecutive pilot symbols the second group of symbols, wherein each group of consecutive pilot symbols of the plurality of evenly spaced groups of consecutive pilot symbols comprises a predefined number of pilot symbols, and wherein each symbol in the second group of symbols is derived from a group of consecutive pilot symbols of the plurality of evenly spaced groups of consecutive pilot symbols by:
   back-rotating each pilot symbol in the group of consecutive pilot symbols in accordance with a known modulation to produce a plurality of back-rotated pilot symbols for the group of consecutive pilot symbols; and producing a combined pilot symbol corresponding to the group of consecutive pilot symbols by adding each of the plurality of back-rotated pilot symbols for the group of consecutive pilot symbols.

8. The method of claim 1, wherein determining at least one of the first frequency offset estimation associated with the block of symbols or the second frequency offset estimation associated with the block of symbols, comprises:
calculating a value of a target function for each hypothesis in a set of frequency hypotheses, the set of frequency hypotheses covering at least one of a frequency range or a frequency offset range;
identifying, from amongst the set of frequency hypotheses, a frequency hypothesis that yields a maximum value for the target function; and
determining, in accordance with the frequency hypothesis that yields the maximum value for the target function, the at least one of the first frequency offset estimation associated with the block of symbols or the second frequency offset estimation associated with the block of symbols.

9. The method of claim 8, comprising:
utilizing a first set of frequency hypotheses to determine the first frequency offset estimation associated with the block of symbols, the first set of frequency hypotheses having a first minimum frequency difference between hypotheses; and
utilizing a second set of frequency hypotheses to determine the second frequency offset estimation associated with the block of symbols, the second set of frequency hypotheses having a second minimum frequency difference between hypotheses that is smaller than the first minimum frequency difference.

10. The method of claim 8, wherein the determining of the at least one of the first frequency offset estimation associated with the block of symbols or the second frequency offset estimation associated with the block of symbols, comprises determining, in accordance with one or more values of the target function that are associated with one or more frequency hypotheses of the set of frequency hypotheses that neighbor the frequency hypothesis that yields the maximum value for the target function, the at least one of the first frequency offset estimation associated with the block of symbols or the second frequency offset estimation associated with the block of symbols.

11. The method of claim 8, wherein the target function comprises a Fast Fourier Transform (FFT) or a Discrete Fourier Transform (DFT).

12. The method of claim 4, wherein the unique word is located at or about a center location of the block of symbols, and wherein if the block of symbols comprises additional pilot symbols, the additional pilot symbols are evenly spaced in a symmetric manner both prior to and after the unique word.

13. A satellite communication system, comprising:
at least one terminal configured to transmit at least one transmission burst that includes at least one block of symbols; and
a hub configured to:
receive the at least one transmission burst from the at least one terminal and to utilize two or more estimation stages to determine at least one of a frequency or a frequency offset of the at least one transmission burst;
back-rotate a plurality of symbols included in the at least one transmission burst in accordance with a frequency offset estimation determined in a previous estimation stage of the two or more estimation stages to produce a plurality of back-rotated symbols;
remove a modulation property from each of the plurality of back-rotated symbols,
sum one or more groups of consecutive back-rotated symbols from amongst the plurality of back-rotated symbols to produce a set of samples; and
calculate, for each frequency hypothesis in a set of frequency hypotheses, a value of a target function associated with at least one estimation stage using the set of samples.

14. The satellite communication system of claim 13, wherein the hub is configured to utilize at least one estimation stage of the two or more estimation stages to account for a timing uncertainty at which the at least one transmission burst could be received.

15. A satellite communication system, comprising:
at least one terminal configured to transmit at least one transmission burst that includes at least one block of symbols, the at least one block of symbols includes a unique word comprising a group of consecutive pilot symbols; and
a hub configured to receive the at least one transmission burst from the at least one terminal, the hub is further configured to:
determine, in accordance with a first group of samples corresponding to the unique word, a first frequency offset estimation associated with the at least one block of symbols;
back-rotate symbols in the at least one block of symbols in accordance with the first frequency offset estimation associated with the at least one block of symbols to produce a second group of samples associated with a second interval longer than a first interval between adjacent symbols in the unique word;
determine, in accordance with the second group of samples associated with the second interval longer than an the first interval between adjacent symbols in the unique word, a second frequency offset estimation associated with the at least one block of symbols;
calculate, in accordance with the second frequency offset estimation associated with the block of symbols, at least one of a phase or a phase offset; and
correct each symbol in the at least one block of symbols in accordance with the second frequency offset estimation associated with the at least one block of symbols and the at least one of the phase or the phase offset.

16. The system of claim 15, wherein the second group of samples corresponds at least in part to evenly spaced pilot symbols.

17. The system of claim 15, wherein the second group of samples corresponds at least in part to a value of a non-linear function performed over modulated symbols.

18. The system of claim 15, wherein the hub is configured to determine at least one of a frequency or a frequency offset by:
calculating, for each hypothesis in a set of hypotheses covering at least one of a frequency range or a frequency offset range, a value of a target function;
identifying, from amongst the set of hypotheses, a hypothesis that yields a maximum value for the target function; and
determining, in accordance with the hypothesis that yields the maximum value for the target function, the at least one of the frequency or the frequency offset.

19. A satellite communication system, comprising:
   at least one terminal configured to transmit a continuous signal; and
   at least one receiving station configured to:
   receive the continuous signal;
   break the continuous signal into one or more successive symbol blocks;
   determine a first group of samples, the first group of samples corresponding to a first group of symbols included in at least one block of symbols of the one or more successive symbol blocks, the first group of samples corresponding to a first interval determined in accordance with a maximum frequency offset;
   determine, in accordance with the first group of samples, a first frequency offset estimation associated with the at least one block of symbols;
   back-rotate one or more symbols in the at least one block of symbols in accordance with at least the first frequency offset estimation;
   produce a second group of samples, the second group of samples corresponding to a second group of symbols that are based at least in part on symbols that are back-rotated according to the first frequency offset estimation, wherein the second group of samples correspond to a second interval that is longer than the first interval determined in accordance with the maximum frequency offset; and
   determine, in accordance with the second group of samples, a second frequency offset estimation associated with the at least one block of symbols.

20. The satellite communication system of claim 19, wherein the one or more successive symbol blocks comprise at least one block of symbols that includes a unique word comprising a group of consecutive pilot symbols, and wherein the receiving station is configured to determine the first group of samples in accordance with the unique word.

* * * * *

UNITED STATES PATENT AND TRADEMARK OFFICE
CERTIFICATE OF CORRECTION

PATENT NO.        : 9,071,327 B2
APPLICATION NO.   : 14/084076
DATED             : June 30, 2015
INVENTOR(S)       : Uzi Ram et al.

It is certified that error appears in the above-identified patent and that said Letters Patent is hereby corrected as shown below:

Claims
Column 16, Claim 15, Line 39:
    In Claim 15, after "than", delete "an"

Signed and Sealed this
Twelfth Day of April, 2016

Michelle K. Lee
*Director of the United States Patent and Trademark Office*